United States Patent [19]

Bennett

[11] Patent Number: 4,567,128

[45] Date of Patent: Jan. 28, 1986

[54] COVER SHEET IN A PHOTOSENSITIVE ELEMENT

[75] Inventor: Allyn N. Bennett, Towanda, Pa.

[73] Assignee: E. I. Du Pont de Nemours and Company, Wilmington, Del.

[21] Appl. No.: 634,129

[22] Filed: Jul. 23, 1984

Related U.S. Application Data

[62] Division of Ser. No. 368,126, Apr. 14, 1982, abandoned.

[51] Int. Cl.⁴ ............................................. G03C 5/00
[52] U.S. Cl. .................................. 430/313; 430/260; 430/271; 430/273; 430/523; 430/950; 430/961
[58] Field of Search ............. 430/273, 271, 523, 950, 430/961, 260, 313

[56] References Cited

U.S. PATENT DOCUMENTS

| | | | |
|---|---|---|---|
| 3,469,982 | 9/1969 | Celeste | 430/272 |
| 3,891,443 | 6/1975 | Halpern et al. | 96/79 |
| 3,984,244 | 10/1976 | Collier et al. | 96/67 |
| 4,059,768 | 11/1977 | Landeghem | 250/486 |
| 4,168,979 | 9/1979 | Okishi et al. | 430/273 |
| 4,193,797 | 3/1980 | Cohen et al. | 430/258 |
| 4,229,518 | 10/1980 | Gray et al. | 430/273 |
| 4,238,560 | 12/1980 | Nakamura et al. | 430/273 |
| 4,252,879 | 2/1981 | Inoue et al. | 430/273 |
| 4,268,611 | 5/1981 | Okishi et al. | 430/273 |
| 4,288,526 | 9/1981 | Oda et al. | 430/272 |
| 4,301,230 | 11/1981 | Tagushi et al. | 430/271 |

*Primary Examiner*—Jack P. Brammer

[57] ABSTRACT

A photosensitive element containing a photosensitive composition sandwiched between a flexible support layer and a removable cover sheet, wherein the cover sheet has a roughened surface.

16 Claims, No Drawings

COVER SHEET IN A PHOTOSENSITIVE ELEMENT

This is a division of application Ser. No. 368,126 filed Apr. 14, 1982, now abandoned.

BACKGROUND OF THE INVENTION

The present invention is directed to an improved photosensitive element with a photosensitive composition sandwiched between a flexible support layer and a removable cover sheet.

U.S. Pat. No. 3,469,982 discloses a negative acting photopolymerizable film resist in which a photopolymerizable layer is sandwiched between a temporary support film and a temporary cover film. This film has gained widespread usage in the manufacture of printed circuits in which the cover film is removed, the photopolymerizable layer is laminated by heat and pressure to a surface, e.g., copper, of a substrate to be permanently modified, the layer is imagewise exposed to actinic radiation, the film support is removed, the unexposed areas of the layer are removed by solvent washout (development), and the resultant bared area of the copper surface is permanently modified, such as by etching or deposition of metal.

The patent discloses solution coating of a photopolymerizable composition onto the support film, followed by drying and then lamination of the resultant dry layer to a surface such as a copper-clad printed circuit board to carry out the photoresist process. In commercial practice, however, the dried photopolymerizable layer, which must remain adhered to the support during storage and shipment, has been supplied as a sandwich between the support film and a cover sheet. This has enabled the sandwich element to be rolled up upon itself by the photoresist manufacturer and be supplied to the user, e.g., printed circuit manufacturer, as a compact, easy to handle roll. The cover film prevents the photopolymerizable layer from adhering to the backside of the support film during shipment and storage. In use, the cover film is stripped away and discarded, followed by the photoresist processing described above.

U.S. Pat. No. 4,193,797 discloses a similar photopolymerizable film resist with a photopolymerizable layer sandwiched between a temporary support film and a temporary cover film except the photpolymerizable composition is positive acting rather than negative acting.

SUMMARY OF THE INVENTION

The present invention is directed to a photosensitive element comprising a flexible support bearing at least one layer of a photosensitive composition and a removable cover sheet, said support having greater adhesion than the cover sheet to form the photosensitive element, whereby the improvement comprises the cover sheet having a roughened finish on its surface which faces away from the photosensitive composition.

DETAILED DESCRIPTION OF THE INVENTION

The types of photosensitive elements of the present invention are well known in the prior art and are of a sandwich structure with a photosensitive composition between a support layer and a cover sheet. This type of photosensitive element generally containing a photopolymerizable polymer has general commercial use as, e.g., resists and solder masks in manufacture of printed circuit boards.

Soft photosensitive resists and solder masks in roll form may suffer from at least one of three major quality problems. First, air generally initially uniformly distributed in laps in the roll can slowly migrate into pockets or bubbles after a roll has been made due to localized stresses (external contact, thickness variations, tension variations, shrinkage variations) These bubbles induce a secondary flow in the soft photosensitive composition causing cosmetic and functional defects (thin spots). The reduced photosensitive composition thickness jeopardizes functionality of the photosensitive layer.

Second, the contraction in the roll of the support or cover sheet, whichever has the highest tendency to shrink, can lead to the gradual formation of wrinkles in the composite structure. This wrinkling also may induce secondary flow resulting in local variations in the thickness of the photosensitive composition.

Third, polymerization of photopolymer can occur during storage in areas of hard bands or gauge variations in the product thickness which cause exclusion of air from the film laps in certain areas. With the cover sheets of the invention, the continued presence of air due to the rough surface in these hard bands may have a strong inhibiting affect on this type of chemical instability.

The use of a roughened finish cover sheet provides for a relatively easy movement and uniform distribution of the air between laps in a roll eliminating or reducing related secondary flow problems. The roughness may provide a uniform compressible cushioning effect that compensates for thickness variation in a photosensitive element. This cushioning can minimize the formation of soft spots in thin product areas, in turn reducing the tendency for the formation of wrinkles. In addition, this cushioning reduces defects in the thicker areas. Also the tendency of defects due to dirt or other high spots to propagate lap to lap can be reduced.

An additional advantage is the rough surface maintains a supply of oxygen between laps even in the hard bands (high stress regions) of a roll. This oxygen can inhibit auto-polymerization of sensitive photopolymers during storage. The modification can increase product shelf life while at the same time reduce the requirement for a heavy loading of inhibitor in the coating formulation which can have an adverse affect on end use sensitometry and performance.

The degree of roughness of the cover sheet surface may vary within wide limits. A critical feature is that a degree of roughness is present which allows air to be present when a photosensitive element is wound into a roll. Excluded from the present definition are conventional smooth cover sheets which inherently have some surface variations. Generally a surface roughness of an average of at least 2 microns, peak to valley distance, is suitable and more preferably an average of at least 4 microns. Generally an upper limit on surface roughness, peak to valley of up to 40 microns and more preferably up to 10 microns is suitable. It is understood that as the thickness of the cover sheet is increased, a greater degree of roughness is suitable, e.g., greater than 40 microns. The frequency of disparities required depends on Young's modulus and thickness of the cover sheet with fewer being required on higher modulus, thick cover sheets to have the same effect. As the surface roughness increases, a greater diameter will generally be obtained when a photosensitive element is wound in a roll. A disadvantage of greater storage area for an equal photosensitive composition is considered a small disadvantage in comparison to the advantage of the present invention. Greater yield such as in making printing circuit boards can be directly realized with the roughened cover sheet. Examples of suitable roughened surfaces are textured, matte and embossed finishes.

In a preferred mode, the surface of the roughened cover sheet which faces away from the photosensitive layer has its opposite surface substantially smooth; i.e., the surface which faces the photosensitive composition. With both surfaces of the cover sheet roughened, nonuniformity of the photosensitive composition could result which is generally undesirable. However with a relatively thick photosensitive composition layer, e.g., for use in a solder mask application, a cover sheet with two roughened surfaces may be tolerated.

A preferred embodiment of the present invention is with the photosensitive element with its sandwich structure present in a roll. A cover sheet or flexible support can be used which allows diffusion of oxygen present in laps of a roll to retard autopolymerization of a photopolymerizable composition. The cover sheet can have channels for air which allows movement of air into laps when the element is wound in a roll. These air channels can go partly into a lap or allow air to pass completely across the width of the roll, i.e., from far edge to edge across the roll.

The cover sheet must have less adhesion to the photosensitive composition in comparison to the support since the cover sheet is removed prior to lamination of the supported photosensitive composition to a substrate. Instead of the roughened cover sheet of the present invention if a roughened support is used, product performance cannot be maintained. Upon exposure to actinic radiation of the photosensitive composition through the support, light is scattered by the presence of the rough support surface and this scattering impairs photographic resolution and image quality. A roughened support surface roughness can impose a functional limitation on compactness of imageable lines and spaces in the manufacture of sophisticated circuit boards or in achieving exact dot scale reproduction critical in graphic arts applications.

Suitable removable, protective cover sheets are well known in the art but without surface roughening. They preferably have a high degree of dimensional stability and may be chosen from a wide variety of sheet materials composed of high polymers, e.g., polyamides, polyolefins, polyesters, vinyl polymers, and cellulose esters, and may have a thickness of from 0.00025 inch (0.0006 cm) to 0.008 inch (0.02 cm) or more. A particularly suitable cover sheet is polyethylene of the thickness range above, preferably about 0.001 inch (0.0025 cm) thick.

Suitable support materials, which are generally strippable and may be chosen from the same high polymers described above and may have the same wide range of thicknesses namely 0.00025 inch (0.0006 cm) to 0.008 inch (0.02 cm) or more. If exposure is to be made before removing the strippable support, it must, of course, transmit a substantial fraction of the actinic radiation incident upon it. If the strippable support is removed prior to exposure, no such restrictions apply. A particularly suitable support is a transparent polyethylene terephthalate film of the thickness range above and preferably about 0.001 inch (0.0025 cm).

The photosensitive composition is generally present in a dry coating thickness of about 0.0003 inch (0.0008 cm) to about 0.01 inch (0.0025 cm). Thicker layers could also be used.

In practicing the invention, photosensitive film resist elements of various types may be used. In general photohardenable, negative-working elements are photopolymerizable elements of the type disclosed in U.S. Pat. No. 3,469,982 and the photocrosslinkable elements of the type disclosed in U.S. Pat. No. 3,526,504. Positive-working, resist elements may be of the photosolubilizable type, e.g., such as the o-quinone diazide elements of U.S. Pat. No. 3,837,860, or of the photodesensitizable type, e.g., such as the bisdiazonium salts of U.S. Pat. No. 3,778,270 or the nitroaromatic compositions of U.K. Pat. No. 1,547,548. Useful flame retardant solder mask compositions are disclosed in U.S. Pat. No. 4,278,752.

The photohardenable layer is prepared from polymeric components (binders), monomeric components, initiators and inhibitors such as described in European patent application No. 81164014.6 or the patents referred to above.

Suitable binders which can be used as the sole binder or in combination with others include the following: polyacrylate and alpha-alkyl polyacrylate esters, e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystyrene polymers and copolymers, e.g., with maleic anhydride and esters; vinylidene chloride copolymers, e.g., vinylidene chloride/acrylonitrile; vinylidene chloride/methacrylate and vinylidene chloride/vinyl acetate copolymers; polyvinyl chloride and copolymers, e.g., polyvinyl chloride/acetate; saturated and unsaturated polyurethanes; synthetic rubbers, e.g., butadiene/acrylonitrile, acrylonitrile/butadiene/styrene, methacrylate/acrylonitrile/butadiene/styrene copolymers, 2-chlorobutadiene-1,3 polymers, chlorinated rubber, and styrene/butadiene/styrene, styrene/isoprene/styrene block copolymers; high molecular weight polyethylene oxides of polyglycols having average molecular weights from about 4,000 to 1,000,000; epoxides, e.g., epoxides containing acrylate or methacrylate groups; copolyesters, e.g., those prepared from the reaction product of a polymethylene glycol of the formula $HO(CH_2)_nOH$, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; nylons or polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, ethyl cellulose and benzyl cellulose; polycarbonates; polyvinyl acetal, e.g., polyvinyl butyral, polyvinyl formal; polyformaldehydes.

The binder may contain sufficient acidic or other groups to render the composition processible in aqueous developer. Useful aqueous-processible binders include those disclosed in U.S. Pat. No. 3,458,311 and in U.K. Pat. No. 1,507,704. Useful amphoteric polymers include interpolymers derived from N-alkylacrylamides or methacrylamides, acidic film-forming comonomer and an alkyl or hydroxyalkyl acrylate such as those disclosed in U.S. Pat. No. 3,927,199.

Suitable monomers which can be used as the sole monomer or in combination with others include the following: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethylacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylated and trimethylacrylate and similar compounds as disclosed in U.S. Pat. No. 3,380,831, 2,2-di(p-hydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol A, di-(3-methacryloxy-2-dydroxypropyl) ether of 1,4-butanediol, di-(3-methacryloxy-2-hydroxypropyl) ether of diphenolic acid, triethylene glycol dimethacrylate, polyoxypropyltrimethylol propane triacrylate (462), ethylene glycol dimethylacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

In addition to the ethylenically unsaturated momoners mentioned above, the photohardenable layer can also contain at least one of the following free radical-initiated, chain-propagating, addition-polymerizable, ethylenically unsaturated compounds having a molecular weight of at least 300. Preferred monomers of this type are an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Especially preferred are those wherein at least one and preferably most of such linkages are conjugated with a double bonded carbon, including carbon double bonded to carbon and to such herteroatoms as nitrogen, oxygen and sulfur. Outstanding are such materials wherein the ethylenically unsaturated groups, especially the vinylidene groups, are conjugated with ester or amide structures.

Preferred free radical-generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2-3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz(a)anthracene-7,12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; α-hydrocarbon-substituted aromatic acyloins, including α-methylbenzoin, α-allylbenzoin and α-phenylbenzoin. Photoreducible dyes and reducing agents disclosed in U.S. Pat. Nos. 2,850,445; 2,875,047; 3,097,096; 3,074,974; 3,097,097; and 3,145,104 as well as dyes of the phenazine, oxazine, and quinone classes; Michler's ketone, benzophenone, 2,4,5-triphenyl-imidazolyl dimers with hydrogen donors, and mixtures thereof as described in U.S. Pat. Nos. 3,427,161; 3,479,185; and 3,549,367 can be used as initiators. Also useful with photoinitiators and photoinhibitors are sensitizers disclosed in U.S. Pat. No. 4,162,162.

Thermal polymerization inhibitors that can be used in photopolymerizable compositions are: p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene, p-toluquinone and chloranil. Also useful for thermal polymerization inhibition are the nitroso compositions disclosed in U.S. Pat. No. 4,168,982.

Various dyes and pigments may be added to increase the visibility of the resist image. Any colorant used, however, should preferably be transparent to the actinic radiation used.

Generally, suitable substrates for the process of the invention involving printed circuit formation are those which have mechanical strength, chemical resistance and good dielectric properties. Thus, most board materials for printed circuits are thermosetting or thermoplastic resins usually combined with a reinforcing agent. Thermosetting resins with reinforcing fillers are ordinarily used for rigid boards, whereas thermoplastic resin without reinforcements are usually used for flexible circuit boards.

Typical board construction involves combinations such as phenolic or epoxy resins on paper or a paper-glass composite, as well as polyester, epoxy, polyimide, polytetrafluorethylene, or polystyrene on glass. In most instances, the board is clad with a thin layer of electroconductive metal of which copper is by far the most common.

Suitable substrates for the process of the invention involving preparation of lithographic printing plates are those which have mechanical stength and surfaces which differ in hydrophilicity or oleophilicity from the surfaces of the imaged photosensitive areas laminated thereto. Such substrates are disclosed in U.S. Pat. No. 4,072,528. While numerous substrates are satisfactory for this purpose thin anodized aluminum plates such as those disclosed in U.S. Pat. No. 3,458,311 are particularly useful.

DESCRIPTION OF SURFACE MEASURING TECHNIQUES

The technique involves viewing a cross section of the cover sheet with an Scanning Electron Microscope by freezing and fracturing the cover sheet. A cover sheet sample to be measured is cut into strips approximately 1 inch by 8 inches long. These strips are then notched near one end to control the fracture point. The notched end of the sample is immersed in liquid nitrogen to above the notch. After the sample is thoroughly frozen (2–5 minutes) the sample is removed and immediately given a quick snap by grabbing both ends, one in each hand, then moving both hands three inches closer together, then suddenly pulling them apart. The whole operation should be completed within 5 seconds of removing from nitrogen to assure as clean fracture. Samples are mounted with the edge vertical and sputtered with a conductive coating. These samples are then mounted in a Scanning Electron Microscope with measurements made at approximately 500X using a Robinson detector. The measurements are made by comparing the 10 micron reference line with the measurements on the photograph. The reference line in this case was 0.6 cm long. Measurements were made with this technique on matted polyethylene used in these experiments with the following results:

The peak height measured was 3 cm as measured from backside. This multiplied by the scale factor of 10 microns per 0.6 cm indicates a total peak height of 50 microns. The distance to the valley was determined to be 2.5 cm on the photographic × 10 microns per 0.6 cm showing that it is 41.6 microns; giving a difference in height from peak to valley of 8.4 microns. Other matted material was measured using this technique finding peak height of 2.8 cm × 10 microns per 0.6 cm = 46.7 microns. Valley height from the backside of the sheet of 2.4 cm × 10 microns per 0.6 cm = 40 microns with a difference of 6.7 microns.

Standard polyethylene which did not demonstrate these properties was also measured and found to have a peak height of 1.6 cm × a scale factor of 10 microns per 0.6 cm giving a peak height of 27.5 microns. With the valley being 1.6 cm × 10 microns per 0.6 cm with the valley being 26.7 microns giving a disparity height 0.8 microns.

In the following examples all parts are by weight unless otherwise indicated.

EXAMPLE 1

A photosensitive element was made from a support which was 0.92 mils of high clarity polyester with 2.2 mils of photopolymer and a cover sheet of polyethylene with an average thickness of 1.7 mils with a peak to valley disparity due to matting of 8.4 microns. This element was compared to the same structure except with standard cover sheet of the same composition which was 1.15 mils thickness with a surface roughness of 0.8 microns measured peak to valley. This later element is sold as Riston ®T-168 photopolymer film resist. The material made using the matted cover sheet showed excellent roll formation and roll stability with no excess air in laps or wrinkle defects after 4 weeks accelerated aging at 40° C. The control rolls made with standard nonmatted cover sheet showed cosmetic air-in-lap 8 hours after slitting which developed into functional defects during oven aging in less than 2 weeks.

EXAMPLE 2 (BEST MODE)

A photosensitive element was made from a support sheet of 2.0 mil of high clarity polyester, a photopolymer layer 3.0 mils thick, and a matted polyethylene cover sheet with an average thickness of 1.7 mils and a roughness of 8.4 microns peak to valley was coated and compared to the same photosensitive element except with standard cover sheet which had an average thickness of 1.15 mils with a peak to valley roughness of 0.8 microns. The later photosensitive element is sold as Vacrel ®830 solder mask. The material was aged 4 weeks at 40° C. accelerated aging. The film made with matted cover sheet showed no signs of excess air entrapment, no wrinkles, and no formation of gauge band type defects. Material made with the standard cover sheet showed air-in-lap, wrinkles, and gauge bands which contributed to overall quality and appearance.

What is claimed is:

1. In a method of making a printed circuit board comprising the steps of:
    (i) laminating a supported photosensitive layer which is photopolymerizable to a surface,
    (ii) exposing imagewise the photosensitive layer to actinic radiation,
    (iii) removing an area of the layer, and
    (iv) modifying permanently by etching or plating a bared area of the surface;
    wherein prior to step (i) the supported photosensitive layer is present in a photosensitive element comprising a flexible support bearing at least one layer of a photosensitive composition and a removable cover sheet, said support having greater adhesion than the cover sheet to form the photosensitive element with the cover sheet being stripped from the photosensitive composition prior to laminating, whereby the improvement comprises the cover sheet in the photosensitive element having a roughened finish on its surface which faces away from the photosensitive composition with the roughened finish having a peak to valley average distance of at least two microns.

2. The method of claim 1 wherein said element is unwound from a roll prior to lamination wherein the roughened finish allows air to be present between laps of the roll.

3. The method of claim 1 wherein said peak to valley average difference is at least 4 microns.

4. The method of claim 1 wherein said peak to valley difference is generally not greater than 10 microns.

5. The method of claim 1 wherein said peak to valley difference is generally not greater than 40 microns.

6. The method of claim 1 wherein the roughness is across the width of the element.

7. The method of claim 2 wherein the cover sheet or support allows diffusion of oxygen which retards autopolymerization of a photopolymerizable composition.

8. The method of claim 7 wherein the cover sheet allows oxygen diffusion.

9. The method of claim 2 wherein the roughened finish includes channels for air which allows movement of air into laps from the edge of the roll.

10. The method of claim 8 wherein the channels allow air to pass completely through laps from one edge of the roll to an opposite edge.

11. The method of claim 2 wherein the roughened finish is a texture finish.

12. The method of claim 2 wherein the roughened finish is a matte finish.

13. The method of claim 2 wherein the roughened finish is an embossed finish.

14. In a method of making a printed circuit board comprising the steps of:
   (i) laminating a supported photosensitive layer which is photopolymerizable to a surface,
   (ii) exposing imagewise the photosensitive layer to actinic radiation,
   (iii) removing an area of the layer, and
   (iv) modifying permanently by etching or plating a bared area of the surface;
   wherein prior to step (i) the supported photosensitive layer is present in a photosensitive element comprising a flexible support bearing at least one layer of a photosensitive composition and a removable cover sheet, said support having greater adhesion than the cover sheet to form the photosensitive element with the cover sheet being stripped from the photosensitive composition prior to laminating,
   whereby the improvement comprises the cover sheet in the photosensitive element having a textured finish on its surface which faces away from the photosensitive composition.

15. In a method of making a printed circuit board comprising the steps of:
   (i) laminating a supported photosensitive layer which is photopolymerizable to a surface,
   (ii) exposing imagewise the photosensitive layer to actinic radiation,
   (iii) removing an area of the layer, and
   (iv) modifying permanently by etching or plating a bared area of the surface;
   wherein prior to step (i) the supported photosensitive layer is present in a photosensitive element comprising a flexible support bearing at least one layer of a photosensitive composition and a removable cover sheet, said support having greater adhesion with the cover sheet being stripped from the photosensitive composition prior to laminating,
   whereby the improvement comprises the cover sheet in the photosensitive element having a matte finish on its surface which faces away from the photosensitive composition.

16. In a method of making a printed circuit board comprising the steps of:
   (i) laminating a supported photosensitive layer which is photopolymerizable to a surface,
   (ii) exposing imagewise the photosensitive layer to actinic radiation,
   (iii) removing an area of the layer, and
   (iv) modifying permanently by etching or plating a bared area of the surface;
   wherein prior to step (i) the supported photosensitive layer is present in a photosensitive element comprising a flexible support bearing at least one layer of a photosensitive composition and a removable cover sheet, said support having greater adhesion than the cover sheet to form the photosensitive element with the cover sheet being stripped from the photosensitive composition prior to laminating,
   whereby the improvement comprises the cover sheet in the photosensitive element having an embossed finish on its surface which faces away from the photosensitive composition.

* * * * *